(12) United States Patent
Ohkubo et al.

(10) Patent No.: US 7,211,870 B2
(45) Date of Patent: May 1, 2007

(54) SEMICONDUCTOR DEVICE

(75) Inventors: Hiroaki Ohkubo, Kanagawa (JP);
Yasutaka Nakashiba, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/245,090

(22) Filed: Oct. 7, 2005

(65) Prior Publication Data
US 2006/0081940 A1   Apr. 20, 2006

(30) Foreign Application Priority Data
Oct. 14, 2004   (JP)   ............................. 2004-300293

(51) Int. Cl.
*H01L 29/76* (2006.01)
(52) U.S. Cl. ................ 257/371; 257/206; 257/E21.421
(58) Field of Classification Search ................ 257/210, 257/216, 299, 349, 355, 369, 371–373, 544, 257/206, 211; 438/200, 284, 286
See application file for complete search history.

(56) References Cited
U.S. PATENT DOCUMENTS
5,796,147 A * 8/1998 Ono ........................... 257/355

6,936,898 B2 * 8/2005 Pelham et al. ............... 257/371
7,049,699 B1 * 5/2006 Masleid et al. ............. 257/758

FOREIGN PATENT DOCUMENTS

JP          07-058289         3/1995
WO      WO 2004/061967 A     7/2004

* cited by examiner

*Primary Examiner*—Quoc Hoang
(74) *Attorney, Agent, or Firm*—Young & Thompson

(57) ABSTRACT

A semiconductor device capable of integrally controlling thresholds of gate electrodes of transistors present in a region of one-conductivity-type and transistors present in a region of an reverse-conductivity-type while suppressing noise propagation is provided. A digital circuit region 123 and an analog circuit region 121 are provided on a P—Si substrate 101. P-wells 103 and 193 and N-wells 105 and 195 are provided in the analog circuit region 121. P-wells 107 and 197 and N-wells 109 and 199 are provided in the digital circuit region 123. A mesh-like deep N-well 111 is provided to contact with lower surfaces of the P-well 103 and the N-well 105. A mesh-like deep N-well 113 is provided to contact with lower surfaces of the P-well 107 and the N-well 109.

6 Claims, 13 Drawing Sheets

SEMICONDUCTOR DEVICE

This application is based on Japanese Patent application NO. 2004-300293, the content of which is incorporated hereinto by reference.

BACKGROUND OF THE INVENTION

1. Field of the Invention

The present invention relates to a semiconductor device.

2. Related Art

For power saving of a semiconductor device such as a processor, it is effective to change a voltage at multiple levels according to a processing load imposed on the semiconductor device such as the processor. Namely, it is effective to change a threshold of a gate electrode of a transistor by controlling a voltage (a back bias) to be applied to a region in the semiconductor device in which region the transistor is provided.

Further, a plurality of regions having different functions are often provided in the semiconductor device such as the processor. It is required to control a threshold of a gate electrode of a transistor for each region. Also in this case, similarly to the above, it is effective to change the threshold of the gate electrode of the transistor by controlling the voltage applied to the region in which the transistor is provided.

There is disclosed a conventional semiconductor device in Japanese Laid-Open patent publication No. 7-58289. FIG. 12 is a cross-sectional view that depicts a transistor formation region of this conventional semiconductor device. Two deep N-wells 5a and 5b into which N type impurities are deeply diffused are formed in a semiconductor substrate 3. A P-well 6a and an N-well 7a are formed in the deep N-well 5a, and a digital circuit (not shown) of a CMOS configuration is formed thereon. The N-well 7a is connected to a digital power supply VDD through a high concentration impurity layer $N^+$. A P-well 6b and an N-well 7b are formed in the N-well 5b, and an analog circuit (not shown) of a CMOS configuration is formed thereon. The N-well 7b is connected to an analog power supply VDD through a high concentration impurity layer $N^+$.

Two N-type high concentration impurity regions $N^+$ and one P-type high concentration impurity region $P^+$ are formed in a P-well 4 formed at a surface of the P-type substrate 3. The P-well 4 is positioned between a region in which the digital circuit is formed (hereinafter, "digital circuit region") and a region in which the analog circuit is formed (hereinafter, "analog circuit region"). One of the two N-type impurity regions $N^+$ is connected to the digital power supply VDD whereas the other N-type impurity region $N^+$ is connected to the analog power supply VDD. The P-type impurity region $P^+$ is connected to a grounding power supply (not shown) through a substrate-dedicated grounding terminal GND, and the P-well 4 serves as a grounding region.

According to the Japanese Laid-Open patent publication No. 7-58289, with this configuration, the digital circuit region and the analog circuit region serve as a triple-well transistor formation region including the deep N-wells, respectively. This transistor formation region electrically isolates the digital circuit from the analog circuit, thereby suppressing an electrical interference between the digital and analog circuits.

There is also disclosed another conventional semiconductor device in WO 2004/061967. FIG. 13 is a plan view for describing a configuration of the semiconductor device disclose in the WO 2004/061967. Namely, FIG. 13 is a top view that depicts a plurality of N-well (e.g., N-well_1 and N-well_2) and a plurality of oblique deep N-well regions (DDNWs) that form a mesh transistor formation region. The oblique deep N-well regions 410A and 410B are orthogonal to the oblique deep N-well regions 412A, 412B, and 412C. The oblique deep N-well regions 412A, 412B, 412C, 410A, and 410B form a mesh transistor formation region 490. A body bias potential Vnw is distributed to the N-wells N-well_1 and N-well_2, thereby applying the body bias to PFETs 470.

A direction of the mesh transistor formation region 490 is oblique to a direction of the N-well_1 and N-well_2. The mesh transistor formation region 490 forms an angle of 45 degrees with respect to a plurality of N-wells (e.g., N-well_1 and N-well_2). The respective oblique deep N-well regions 412A, 412B, 412C, 410A, and 410B are linear, doped with N-impurities, and provided below the N-well_1 and N-well_2 in the semiconductor device.

According to the conventional technique disclosed in the Japanese Laid-Open patent publication No. 7-58289, however, since a plurality of island-type N-wells are provided in the sea-like P-substrate, it is disadvantageously difficult to integrally adjust well potentials of the N-wells. As a result, it is disadvantageously difficult to integrally adjust thresholds of gate electrodes of PMOS circuits in the N-wells. To enable to integrally adjust the potentials of a plurality of N-wells, it is necessary to additionally provide metal interconnections among the N-wells. This disadvantageously complicates an interconnect layout and increases a chip area.

According to the conventional technique disclosed in the WO 2004/061967, a noise tends to be propagated among a plurality of regions having different characteristics. Namely, in this semiconductor device, the mesh transistor formation region 490 that supplies the body bias (back bias) to the N-well_1, N-well_2, P-well, and the like is formed. Due to this, if a plurality of regions having different characteristics and including a digital circuit, an analog circuit, and the like are formed in the N-well_1, N-well_2, and P-well on the mesh transistor formation region 490, respectively, the noise tends to be propagated among the regions having different characteristics through the deep N-well regions 412A, 412B, 412C, 410A, and 410B that supply potentials to the N-well_1, N-well_2, and the like.

SUMMARY OF THE INVENTION

The present invention has been achieved in view of the above-stated situations. The present invention is to provide a semiconductor device that can integrally control thresholds of gate electrodes of transistors present in regions of one-conductivity-type and those on regions of an reverse-conductivity-type while suppressing noise propagation.

According to the present invention, there is provided a semiconductor device comprising: a semiconductor substrate of one-conductivity-type; and a plurality of transistor formation regions provided at the semiconductor substrate, wherein each of the plurality of transistor formation regions includes: a first region of the one-conductivity-type formed at an element formation surface side of the semiconductor substrate; a first transistor provided on the first region; a second region of an reverse-conductivity-type formed at the element formation surface of the semiconductor substrate; a second transistor provided on the second region; and a lower region of the reverse-conductivity-type formed on a bottom side relative to the first region and the second region, and coming in contact with a lower surface of the second region, the lower region has a plane shape to include an opening that vertically penetrates the lower region, the first region and a bottom-side region of the semiconductor substrate are electrically connected to each other through the opening, the lower regions included in the plurality of transistor formation regions are formed to be isolated from one another, and the second regions included in the plurality of transistor formation regions are formed to be isolated from one another.

With this configuration, the lower region of the reverse-conductivity-type formed at the bottom side of the semiconductor substrate relative to the first region and the second region and coming in contact with the lower surface of the second region is provided in each transistor formation region. It is, therefore, possible to integrally control thresholds of gate electrodes of transistors present on the regions of the reverse-conductivity-type.

Further, with this configuration, the lower surface of the first region and the bottom-side region of the semiconductor substrate are electrically connected to each other through the opening that vertically penetrates the lower region in each transistor formation region. It is, therefore, possible to integrally control thresholds of gate electrodes present on the regions of the one-conductivity-type.

With this configuration, the lower regions are isolated from one another and the second regions are isolated from one another. It is, therefore, possible to suppress noise propagation through the lower regions among a plurality of transistor formation regions.

With this configuration, therefore, the semiconductor device that can integrally control the thresholds of the gate electrodes of the transistors present on the regions of one-conductivity-type and those present on the regions of the reverse-conductivity-type while suppressing the noise propagation can be obtained.

In the present invention, the "bottom-side region of the semiconductor substrate" means a region of one-conductivity-type that is positioned at the bottom side of the semiconductor substrate relative to the lower region, and does not mean restriction of the absolute position. In addition, in the present invention, "upper" means an element formation surface side of the semiconductor substrate. In the present invention, "lower" means a bottom side of the semiconductor substrate.

Further, in the present invention, "the first region of one-conductivity-type in the transistor formation region" is a region above the lower region. This first region may be formed by either injecting impurities into the semiconductor substrate of the one-conductivity-type or not injecting impurities thereinto.

According to the present invention, it is possible to obtain the semiconductor device that can integrally control the thresholds of the gate electrodes of the transistors present on the regions of one-conductivity-type and those present on the regions of the reverse-conductivity-type while suppressing the noise propagation since the semiconductor device includes a plurality of transistor formation regions each having a specific configuration.

According to the present invention, the semiconductor device can be configured so that each of the plurality of transistor formation regions further includes a potential control unit electrically connected to the lower region.

With this configuration, potentials of the lower regions can be independently controlled among a plurality of transistor formation regions. As a result, the thresholds of the gate electrodes of the transistors present on the regions of the reverse-conductivity-type can be independently controlled among a plurality of transistor formation regions.

Further, according to the present invention, the semiconductor device can be configured so that in at least one transistor formation region of the plurality of transistor formation regions, a plurality of second regions are provided, and so that the plurality of second regions are electrically connected to one another through the lower region.

With this configuration, in at least one transistor formation region, potentials of the plurality of second regions can be integrally controlled through the lower region. As a result, the thresholds of the gate electrodes of the transistors present on the regions of the reverse-conductivity-type can be integrally controlled in at least one transistor formation region.

According to the present invention, the semiconductor device can be configured so that in at least one transistor formation region of the plurality of transistor formation regions, a plurality of first regions are provided, and so that each of the plurality of first regions is electrically connected to the bottom-side region of the semiconductor substrate through the opening.

With this configuration, in at least one transistor formation region, potentials of the plurality of first regions can be integrally controlled through the opening of the lower region and the bottom-side region of the semiconductor substrate. As a result, the thresholds of the gate electrodes of the transistors present on the regions of the one-conductivity-type can be integrally controlled in at least one transistor formation region.

According to the present invention, in at least one transistor formation region of the plurality of transistor formation regions, a plane shape of the lower region may be one of a lattice shape and a comb shape.

With this configuration, potentials of the second regions can be integrally controlled through the lower regions each having the lattice-type or comb-type plane shape. In addition, potentials of the first regions can be integrally controlled through the openings of the lattice-type or comb-type lower regions.

According to the present invention, at least one transistor formation region of the plurality of transistor formation regions can constitute at least a part of one of a digital circuit and an analog circuit, and another at least one transistor formation region of the plurality of transistor formation regions can constitute at least a part of the other one of the digital circuit and the analog circuit.

With this configuration, the thresholds of the gate electrodes of the transistors provided on the regions of the reverse-conductivity-type can be independently controlled between the digital circuit and the analog circuit. In addition, the noise propagation through the lower regions can be controlled between the digital circuit and the analog circuit.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary embodiments of the present invention will be described hereinafter with reference to the drawings. Like constituent elements are denoted by the same reference symbols throughout the drawings and they will not be repeatedly described.

<First Embodiment>

Figure 1A:
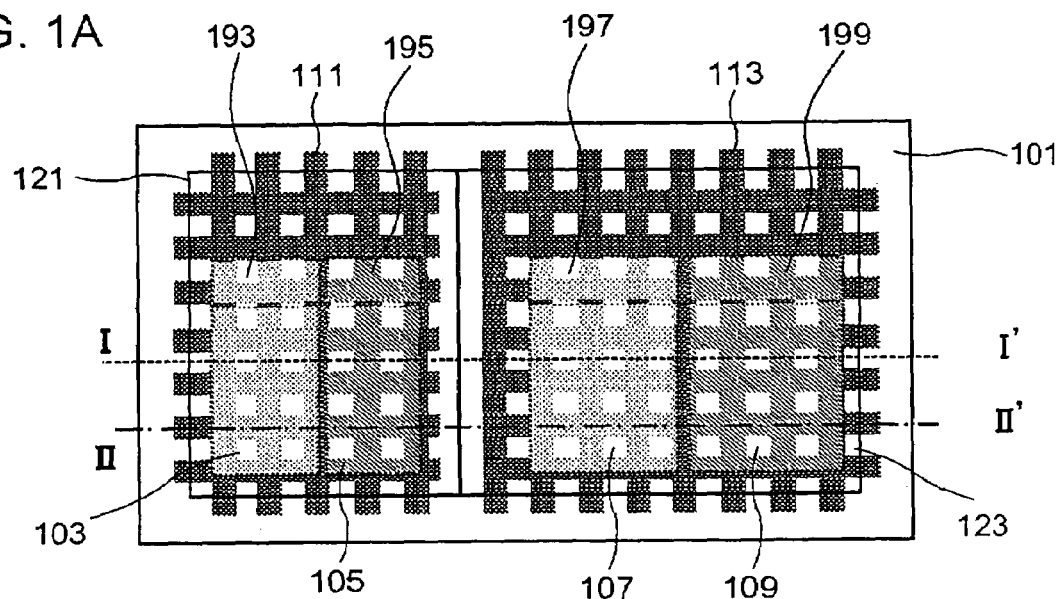
FIGS. 1A to 1C are a plan view, and cross-sectional views for describing a configuration of a semiconductor device according to a first embodiment of the present invention.
Figure 1B:
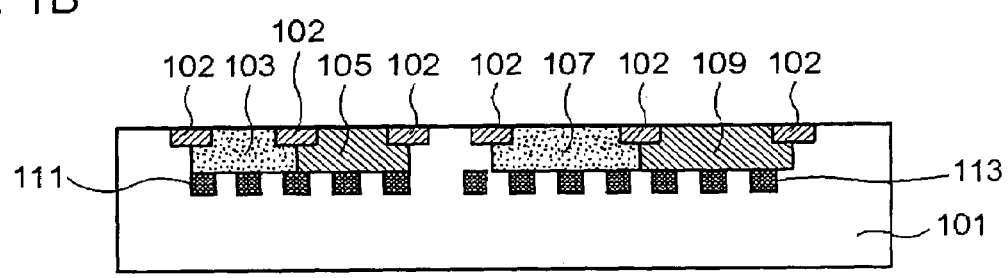
Figure 1C:
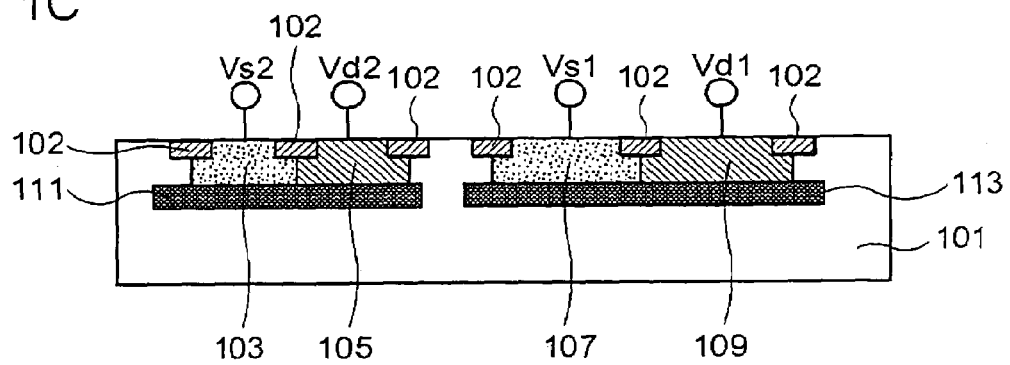

FIGS. 1A, 1B, and 1C are a plan view and cross-sectional views for describing a configuration of a semiconductor device according to a first embodiment of the present invention. Although circuits configured by elements including a MOS transistor are actually provided in the semiconductor device shown in FIGS. 1A to 1C, they are not shown for convenience of illustration.

FIG. 1A is a plan view for describing the configuration of the semiconductor device according to this embodiment. The semiconductor device according to the first embodiment includes a P—Si substrate 101 (a semiconductor substrate of one-conductivity-type). In addition, a digital circuit region 123 and an analog circuit region 121 (a plurality of transistor formation regions) are formed on the P—Si substrate 101.

Figure 10:
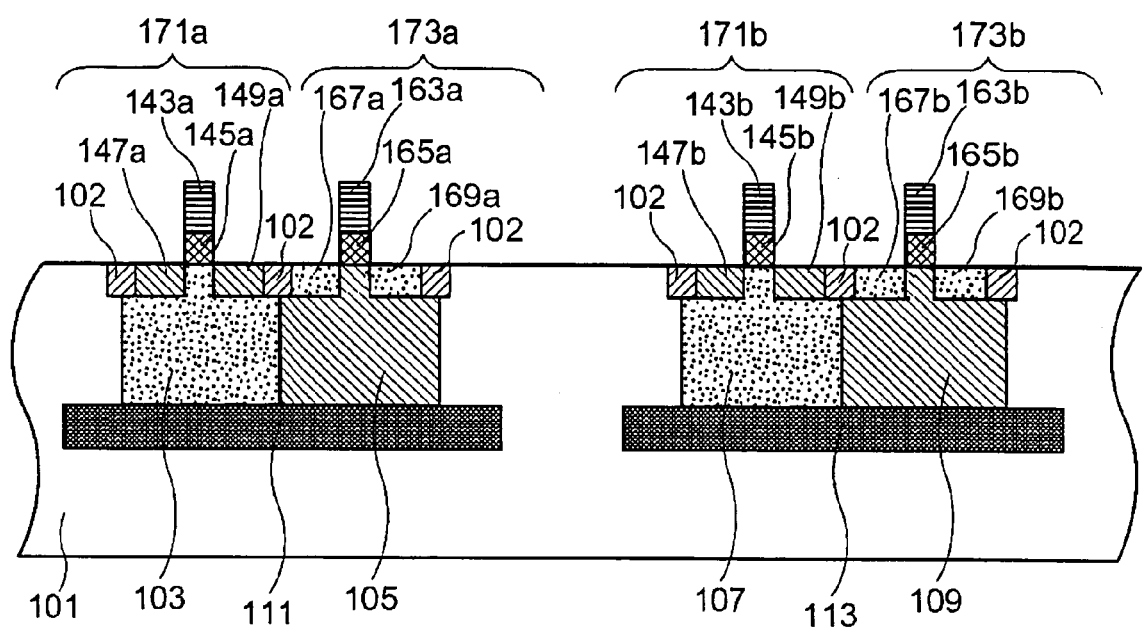
FIG. 10 is a step cross-sectional view for describing steps of manufacturing the semiconductor device according to the first embodiment of the invention.

The analog circuit region 121 and the digital circuit region 123 include P-wells 103 and 193 and P-wells 107 and 197 (first regions of one-conductivity-type), respectively, which are formed at an element formation surface of the P—Si substrate 101. NMOS transistors 171a and 171b (first transistors, which are not partially shown), to be described later with reference to FIG. 10, are formed on each of the P-wells 103 and 193, and each of the P-wells 107 and 197, respectively.

The analog circuit region 121 and the digital circuit region 123 include N-wells 105 and 195 and N-wells 109 and 199 (second regions of an reverse-conductivity-type), respectively which are formed at the element formation surface of the P—Si substrate 101. PMOS transistors 173a and 173b (second transistors, which are not partially shown), to be described later with reference to FIG. 10, are formed on each of the N-wells 105 and 195, and each of the N-wells 109 and 199, respectively.

FIG. 1B is a cross-sectional view of the semiconductor device shown in FIG. 1A taken along a line I–I' of FIG. 1A. FIG. 1C is a cross-sectional view of the semiconductor device shown in FIG. 1 A taken along a line II–II' of FIG. 1A. The analog circuit region 121 and the digital circuit region 123 include mesh-like deep N-wells 111 and 113 (lower regions of the reverse-conductivity-type), respectively, which are provided on a bottom side of the P—Si substrate 101 relative to the P-wells 103 and 107 and the N-wells 105 and 109.

If viewed from the element formation surface side of the P—Si substrate 101, the deep N-wells 111 and 113 are square lattice-type as shown in FIG. 1A. The deep N-wells 111 and 113 come in contact with lower surfaces of the N-wells 105 and 109, respectively. Lower surfaces of the P-wells 103 and 107 are electrically connected to the bottom side of the P—Si substrate 101 relative to the N-wells 111 and 113 by openings vertically penetrating the deep N-wells 111 and 113 of the P—Si substrate 101 (openings that vertically penetrate the lower regions), respectively.

The deep N-wells 111 and 113 are isolated from each other between the analog circuit region 121 and the digital circuit region 123. The N-wells 105 and 109 are also isolated from each other between the analog circuit region 121 and the digital circuit region 123. Element isolation regions 102 (STI) are provided around the N-wells 105 and 109 and the P-wells 103 and 107 at the element formation surface of the P—Si substrate 101.

A plurality of N-wells (N-wells 105 and 195 and N-wells 109 and 199) are provided in the analog circuit region 121 and the digital circuit region 123, respectively. The N-wells 105 and 195 are electrically connected to each other through the mesh deep N-well 111. The N-wells 109 and 199 are electrically connected to each other through the mesh deep N-well 113.

A plurality of P-wells (P-wells 103 and 193 and P-wells 107 and 197) are provided in the analog circuit region 121 and the digital circuit region 123, respectively. The P-wells 103 and 193 are electrically connected to each other through the opening that vertically penetrates the mesh deep N-well 111 (a gap formed by the deep N-well 111 in the P—Si substrate 101) and a bottom-side region of the P—Si substrate 101 (bottom-side region of the P—Si substrate 101 relative to the mesh deep N-well 111). The P-wells 107 and 197 are electrically connected to each other through the opening that vertically penetrates the mesh deep N-well 113 and the bottom-side region of the P—Si substrate 101.

The analog circuit region 121 and the digital circuit region 123 include voltage application units Vd2 and Vd1 (potential control units) electrically connected to the deep N-wells 111 and 113 through the N-wells 105 and 109, respectively. The voltage application units Vd1 and Vd2 can be controlled independently of each other.

The analog circuit region 121 and the digital circuit region 123 also include voltage application units Vs2 and Vs1 (potential control units) electrically connected to the P-wells 103 and 107, respectively. In FIG. 1C, the voltage application units Vs2 and Vs1 are electrically connected to each other through the P-wells 103 and 107, the P-openings (not show) of the deep N-wells 111 and 113, and the P—Si substrate 101. Due to this, only one of the voltage application units Vs1 and Vs2 may be provided.

An operation of the semiconductor device according to the first embodiment will be described hereinafter.

In this embodiment, a power supply (not shown) is provided outside of the semiconductor device and a power supply voltage is set to 1.0 volt. Four independently controllable voltage adjustors (not shown) are connected to this power supply. Through these four independently controllable voltage adjustors, the power supply is connected to the voltage application units Vd1, Vd2, Vs1, and Vs2, respectively.

A desired voltage (Vp) from zero to 2.0 volts is equally applied to the voltage application units Vs1 and Vs2. Desired voltages (Vn1 and Vn2) from 1.0 to 3.0 volts are applied to the voltage application units Vd1 and Vd2, respectively.

If so, the voltage (Vp) applied to the voltage application units Vs1 and Vs2 is applied to the P-wells 197 and 193 through the P-wells 107 and 103, the P-openings of the deep N-wells 113 and 111, and the bottom side of the P—Si substrate 101, respectively. Thresholds of gate electrodes of NMOS transistors on the P-wells 103, 107, 193, and 197 are thereby uniformly adjusted.

Further, the voltage (Vn1) applied to the voltage application unit Vd1 is applied to the N-well 199 through the N-well 109 and the deep N-well 113, thereby uniformly adjusting the thresholds of the gate electrodes of the PMOS transistors on the N-wells 109 and 199.

The voltage (Vn2) applied to the voltage application unit Vd2 is applied to the N-well 195 through the N-well 105 and the deep N-well 111, thereby uniformly adjusting the thresholds of the gate electrodes of the PMOS transistors on the N-wells 105 and 195.

Steps of manufacturing the semiconductor device according to the first embodiment will now be described.

Figure 7A:
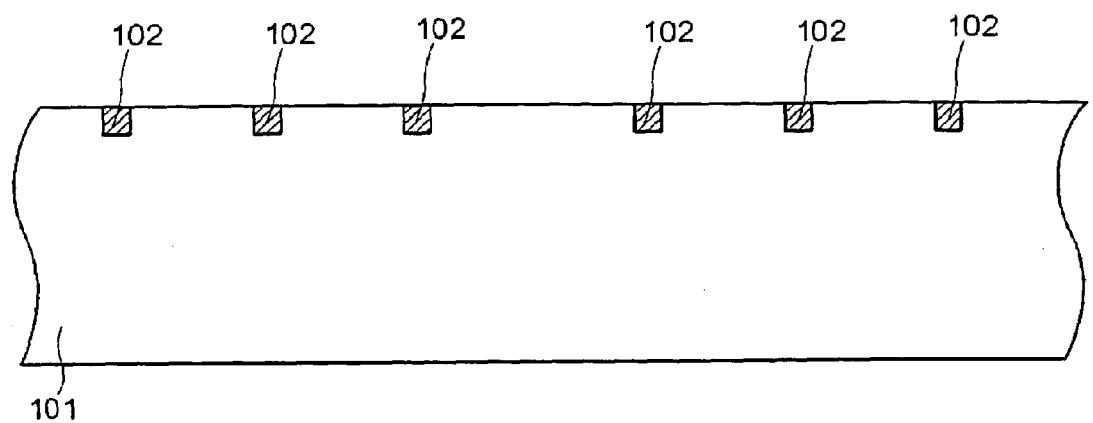
FIGS. 7A and 7B are step cross-sectional view for describing steps of manufacturing the semiconductor device according to the first embodiment of the invention.
Figure 7B:
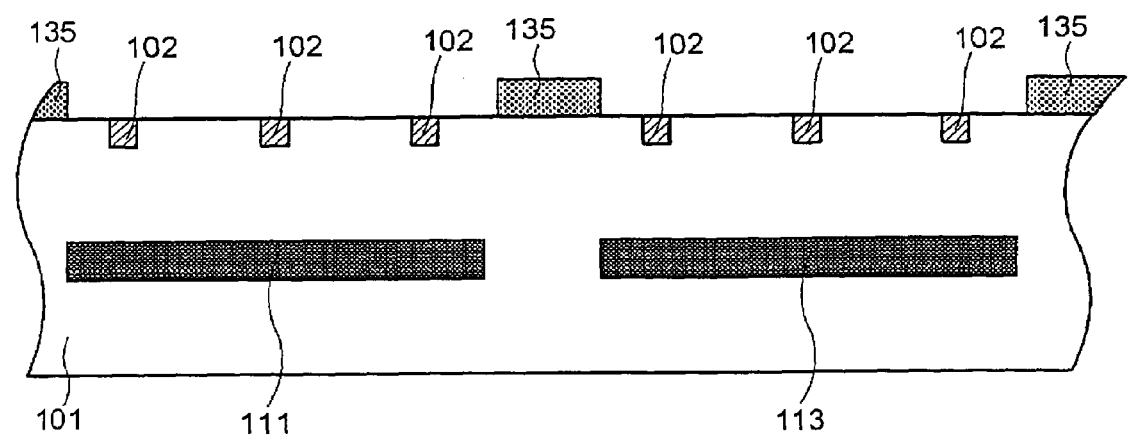

FIGS. 7A and 7B are step cross-sectional views for describing the steps of manufacturing the semiconductor device according to the first embodiment.

As shown in FIG. 7A, the predetermined element isolation regions 102 are formed on the element formation surface of the P—Si substrate 101 by a well-known method. The element isolation regions (STI) 102 are formed by forming shallow grooves in predetermined regions on the element formation surface of the P—Si substrate 101 using a mask (not shown), and burying an insulating material into the grooves or forming insulating films on inside surfaces of the grooves, and then filling one of various materials into the grooves.

As shown in FIG. 7B, using a photoresist mask 135 obtained by applying and patterning a photoresist on the element formation surface of the P—Si substrate 101, phosphorus ions are implanted into the P—Si substrate 101 under conditions of for example, 1 MeV and $2 \times 10^{13}$ cm$^{-2}$, thereby forming the deep N-wells 111 and 113 in regions at a predetermined depth from the element formation surface to be isolated from each other. At this time, the deep N-wells 111 and 113 are formed into meshes (square lattices or oblique lattices) if viewed from the element formation surface side of the P—Si substrate 101. These deep N-wells 111 and 113 are formed in regions in which the analog circuit region 121 and the digital circuit region 123, to be described later, are planned to be formed, respectively.

Figure 8A:
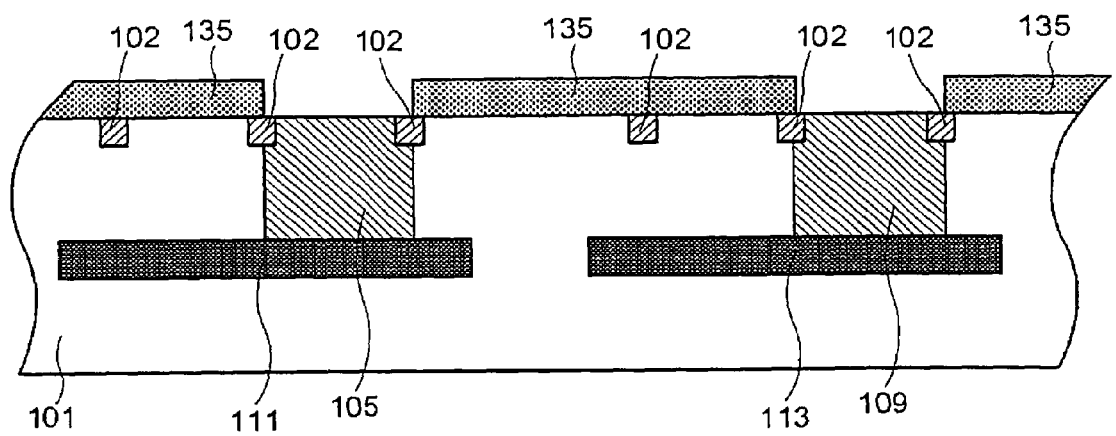
FIGS. 8A and 8B are step cross-sectional views for describing steps of manufacturing the semiconductor device according to the first embodiment of the invention.
Figure 8B:
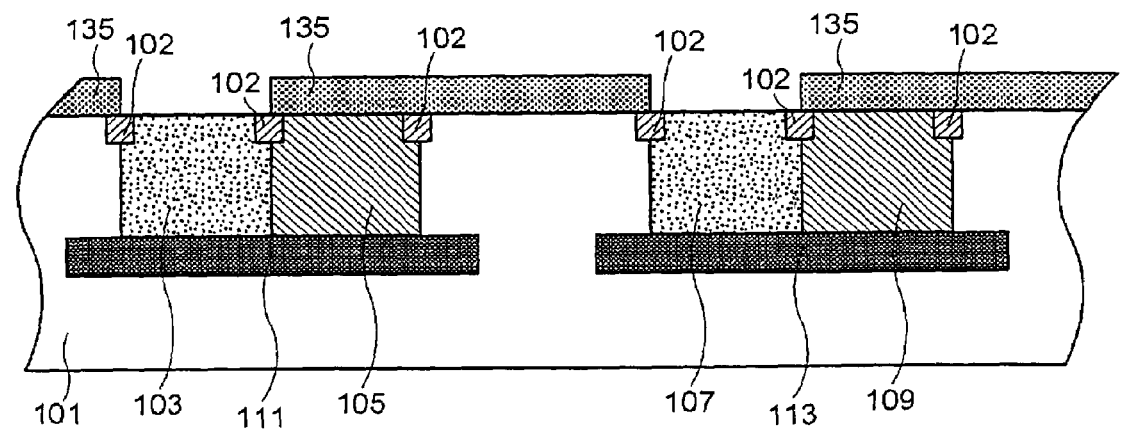

FIGS. 8A and 8B are step cross-sectional views for describing steps of manufacturing the semiconductor device according to this embodiment.

As shown in FIG. 8A, following FIG. 7B, the photoresist mask 135 is removed. Using another photoresist mask 135 obtained by applying and patterning a photoresist again on the element formation surface of the P—Si substrate 101, phosphorus ions are implanted into the P—Si substrate 101 under conditions of for example, 450 keV and $2 \times 10^{13}$ cm$^{-2}$, thereby forming the N-wells 105 and 109 on the deep N-wells 111 and 113, respectively. At this time, the lower surfaces of the N-wells 105 and 109 are bonded to upper surfaces of the deep N-wells 105 and 109, respectively. These N-wells 105 and 109 are formed below regions in which the PMOS transistors 173a and 173b, to be described later, are planned to be formed, respectively.

As shown in FIG. 8B, the photoresist mask 135 is removed. Using yet another photoresist mask 135 obtained by applying and patterning a photoresist again on the element formation surface of the P—Si substrate 101, boron ions are implanted into the P—Si substrate 101 under conditions of for example, 180 keV and $3 \times 10^{13}$ cm$^{-2}$, thereby forming the P-wells 103 and 107, respectively. At this time, lower surfaces of the P-wells 103 and 107 are bonded to upper ends of the P-openings that vertically penetrate the deep N-wells 111 and 113, respectively. These P-wells 103 and 107 are formed below regions in which the NMOS transistors 171a, 171b, and the like, to be described later, are planned to be formed, respectively.

Figure 9A:
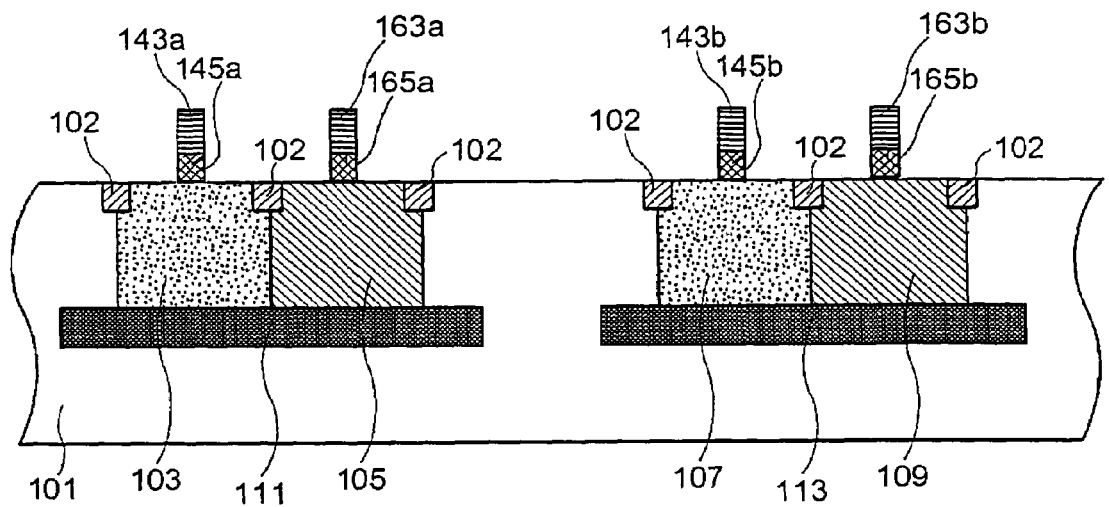
FIGS. 9A and 9B are step cross-sectional views for describing steps of manufacturing the semiconductor device according to the first embodiment of the invention.
Figure 9B:
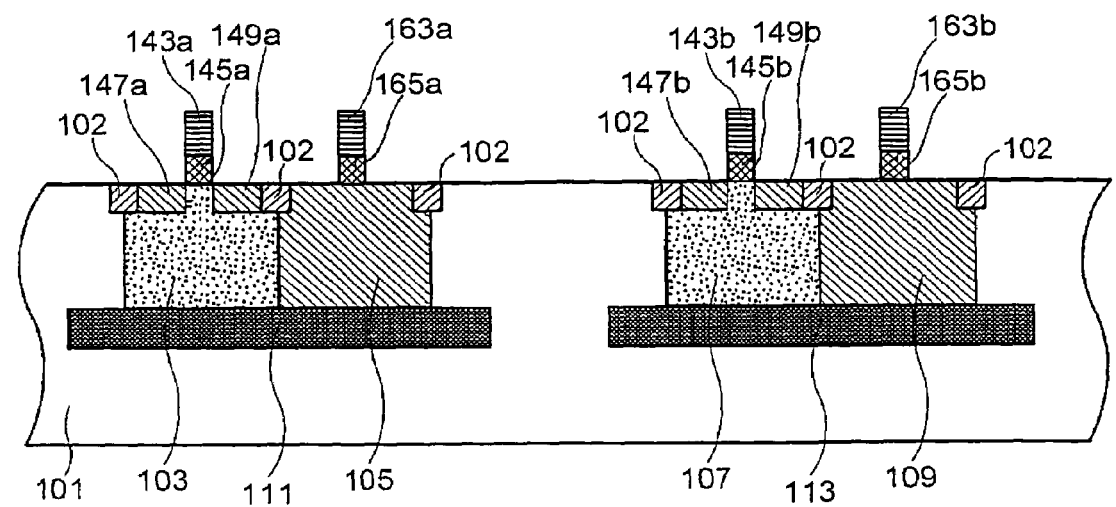

FIGS. 9A and 9B are step cross-sectional views for describing steps of manufacturing the semiconductor device according to this embodiment.

As shown in FIG. 9A, following FIG. 8B, the photoresist mask 135 is removed, and gate insulating films 145a, 145b, 165a, and 165b are formed on the element formation surface in regions in which the NMOS transistors 171a and 171b and the PMOS transistors 173a and 173b, to be described later, are planned to be formed, respectively, by a well-known method. Gate electrodes 143a, 143b, 163a, and 163b composed of polysilicon films are formed on the gate insulating films 145a, 145b, 165a, and 165b, respectively. (Note that sidewalls are not shown therein.)

Specifically, a part of the element formation surface of the P—Si substrate 101 is thermally oxidized, thereby forming the gate insulating films 145a, 145b, 165a, and 165b composed of silicon oxide films. In addition, a polysilicon film is formed on the element formation surface of the P—Si substrate 101 and selectively etched and patterned using a photoresist (not shown), thereby forming the gate electrodes 143a, 143b, 163a, and 163b.

As shown in FIG. 9B, while the regions in which the PMOS transistors 173a and 173b are planned to be formed (in which the N-wells 105 and 109 are formed) are covered with a photoresist mask (not shown), arsenic (As) ions are implanted into the P-wells 103 and 107 under conditions of for example, 30 keV and $5 \times 10^{15}$ cm$^{-2}$. N$^+$ diffused regions 147a, 149a, 147b, and 149b that function as source or drain electrodes of the NMOS transistors 171a and 171b are thereby formed.

FIG. 10 is a step cross-sectional view for describing steps of manufacturing the semiconductor device according to this embodiment.

As shown in FIG. 10, while the regions in which the NMOS transistors 171a and 171b are planned to be formed (in which the P-wells 103 and 107 are formed) are covered with a photoresist mask (not shown), boron (B) ions are implanted into the N-wells 105 and 109 under conditions of for example, 2 keV and $5 \times 10^{15}$ cm$^{-2}$. P$^+$ diffused regions 167a, 169a, 167a, and 169b that function as source or drain electrodes of the PMOS transistors 173a and 173b are thereby formed.

Although not shown in FIG. 10, terminals for the voltage application units Vs1 and Vs2 are formed on the P-wells 107 and 103 in the digital circuit region 123 and the analog circuit region 121, respectively, by a well-known method. In addition, terminals for the voltage application units Vd1 and Vd2 are formed on the N-wells 109 and 105 in the digital circuit region 123 and the analog circuit region 121, respectively, by a well-known method.

Although not described with reference to FIGS. 7A and 7B to FIG. 10, the P-wells 193 and 197 and the N-wells 195 and 199 are manufactured in the same manufacturing steps as those stated above. In addition, the NMOS transistors on the P-wells 193 and 197 and PMOS transistors on the N-wells 195 and 199 are formed in the same manufacturing step as those stated above.

Now, functions and advantages of the semiconductor device according to the first embodiment will be described.

The semiconductor device according to this embodiment can integrally control the thresholds of the gate electrodes of the NMOS transistors present on the P-wells and those of the PMOS transistors present on the N-wells while suppressing the noise propagation in the digital circuit region 123 and the analog circuit region 121, respectively.

Namely, with this configuration, the deep N-well 111 in contact with the lower surfaces of the N-wells 105 and 195 is provided on the bottom side of the P—Si substrate 101 relative to the P-wells 103 and 193 and the N-wells 105 and 195 in the analog circuit region 121.

Due to this, the potentials of the N-wells 105 and 195 can be adjusted to the equal potential through the deep N-well 111. As a result, the thresholds of the gate electrodes of the PMOS transistors present on the N-wells 105 and 195 can be integrally controlled. In addition, the potentials of the P-wells 103 and 193 can be adjusted to the equal potential through the P-opening that vertically penetrates the deep N-well 111 and the bottom side of the P—Si substrate 101. Consequently, the thresholds of the gate electrodes of the NMOS transistors present on the P-wells 103 and 193 can be integrally controlled.

Further, with this configuration, the deep N-well 113 in contact with the lower surfaces of the N-wells 109 and 199 is provided on the bottom side of the P—Si substrate 101 relative to the P-wells 107 and 197 and the N-wells 109 and 199 in the digital circuit region 123.

Due to this, the potentials of the N-wells 109 and 199 can be adjusted to the equal potential through the deep N-well 113. As a result, the thresholds of the gate electrodes of the PMOS transistors present on the N-wells 109 and 199 can be integrally controlled. In addition, the potentials of the P-wells 107 and 197 can be adjusted to the equal potential through the P-opening that vertically penetrates the deep N-well 113 and the bottom side of the P—Si substrate 101. Consequently, the thresholds of the gate electrodes of the NMOS transistors present on the P-wells 107 and 197 can be integrally controlled.

With this configuration, the deep N-wells 111 and 113 that supply the back bias are isolated from each other between the analog circuit region 121 and the digital circuit region 123. Further, the N-wells 105 and 195 and the N-wells 109 and 199 are isolated from each other between the analog circuit region 121 and the digital circuit region 123. The voltage application units Vd1 and Vd2 that supply potentials to the N-wells 105, 195, 109, and 199 are also isolated from each other between the analog circuit region 121 and the digital circuit region 123. It is, therefore, possible to suppress the noise propagation through the deep N-wells 111 and 113 between the analog circuit region 121 and the digital circuit region 123.

In this semiconductor device, the deep N-wells that supply the back bias from the digital circuit region 123 to the analog circuit region 121 are formed to be isolated from each other. Due to this, it is possible to suppress the noise propagation through the deep N-wells that supply the back bias from the digital circuit region 123 to the analog circuit region 121. As a result, it is possible to obtain the semiconductor device capable of reducing power consumption by the back bias while reducing substrate noise.

According to this embodiment, it is possible to realize reduction in the size of the semiconductor device. Namely, with this configuration, since the potentials of the P-wells 103, 193, 107, and 197 are adjusted to the equal potential, interconnections drawn outside the P—Si substrate 101 can be omitted. In addition, since the potentials of the N-wells 105 and 195 are adjusted to the equal potential, interconnections drawn outside the P—Si substrate 101 can be omitted. Since the potentials of the N-wells 109 and 199 are adjusted to the equal potential, interconnections drawn outside the P—Si substrate 101 can be omitted. According to this semiconductor device, therefore, it is possible to reduce the interconnections drawn outside the P—Si substrate 101 and to thereby realize the reduction in the size of the semiconductor device.

Moreover, according to this embodiment, flexibility in semiconductor device design can be improved and manufacturing margin can be widened. Namely, the N-wells 105, 195, 109, and 199 and the P-wells 103, 193, 107, and 197 are all wider than the width of each side of the lattice-type deep N-wells 111 and 113 and larger in area than the openings that vertically penetrate the deep N-wells 111 and 113. Due to this, no matter how the N-wells and P-wells are arranged in the analog circuit region 121 and the digital circuit region 123, the N-wells 105, 195, 109, and 199 and the P-wells 103, 193, 107, and 197 are all in contact with the deep N-wells 111 and 113 and the P-openings that vertically penetrate the deep N-wells 111 and 113. As a result, the flexibility in semiconductor device design can be improved and the manufacturing margin can be widened.

<Second Embodiment>

Figure 2:
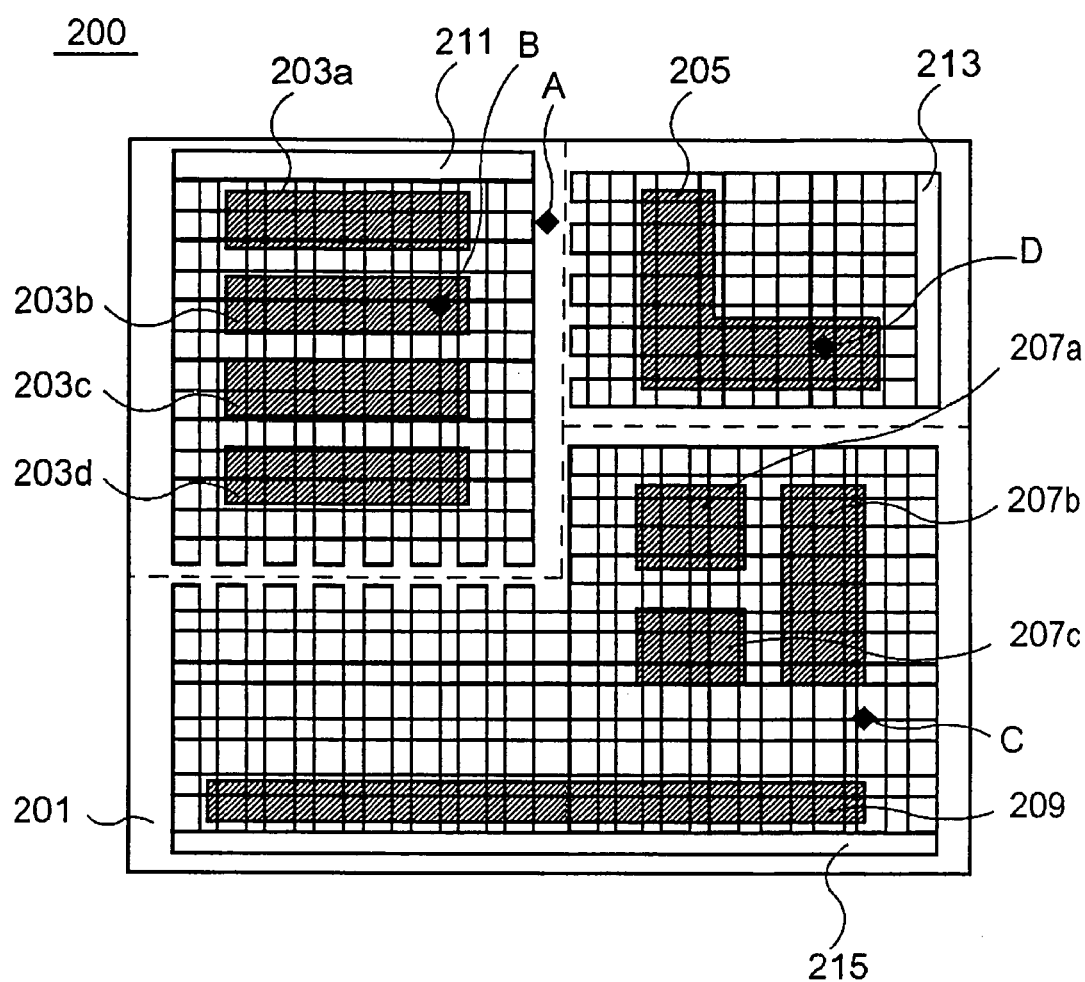
FIG. 2 is a plan view for describing a configuration of a semiconductor device according to a second embodiment of the present invention.

FIG. 2 is a plan view that typically depicts a configuration of a semiconductor device according to a second embodiment of the present invention.

The configuration of a semiconductor device 200 according to the second embodiment is basically equal to that of the semiconductor device according to the first embodiment. The second embodiment differs from the first embodiment in arrangement of P-wells, N-wells, and deep N-wells. In this embodiment, the same configuration as that according to the first embodiment will not be described repeatedly.

The semiconductor device 200 according to this embodiment is configured so that N-wells 203a, 203b, 203c, 203d, 205, 207a, 207b, 207c, and 209 (second regions of an opposite conduction type) are provided at an element formation surface of a P—Si substrate 201. A square lattice-type deep N-well 211 is provided to contact with lower surfaces of the N-wells 203a, 203b, 203c, and 203d. A square lattice-type deep N-well 213 is provided to contact with a lower surface of the N-well 205. A square lattice-type deep N-well 215 is provided to contact with lower surfaces of the N-wells 207a, 207b, 207c, and 209.

The parts of the regions where N-wells 203a, 203b, 203c, 203d, 205, 207a, 207b, 207c, and 209 are not formed above the deep N-wells are P-regions (first regions of one-conductivity-type).

PMOS transistors are provided on all of the N-wells 203a, 203b, 203c, 203d, 205, 207a, 207b, 207c, and 209. In FIG. 2, only PMOS transistors B and D are shown for convenience of illustration. Further, although a plurality of NMOS transistors are provided on the P—Si substrate 201, only NMOS transistors A and C are shown in FIG. 2 for convenience of illustration.

In this embodiment, parts partitioned by dotted lines correspond to transistor formation regions, respectively.

Functions and advantages of the semiconductor device 200 according to this embodiment will be described. This embodiment exhibits the following functions and advantages as well as those of the semiconductor device according to the first embodiment.

According to this embodiment, noise propagation through the deep N-wells 211, 213, and 215 can be suppressed among three or more regions. Namely, the square lattice-type deep N-wells 211, 213, and 215 are isolated from one another. For example, the N-wells 203a, 203b, 203c, 203d, 205, 207a, 207b, 207c, and 209 are also isolated from one another. Due to this, even if noise occurs to the PMOS transistor B on the N-well 203b, propagation of the noise to the PMOS transistor D on the N-well 205 is suppressed. It is, therefore, possible to suppress the noise propagation through the deep N-wells 211, 213, and 215 among three or more regions.

<Third Embodiment>

Figure 3:
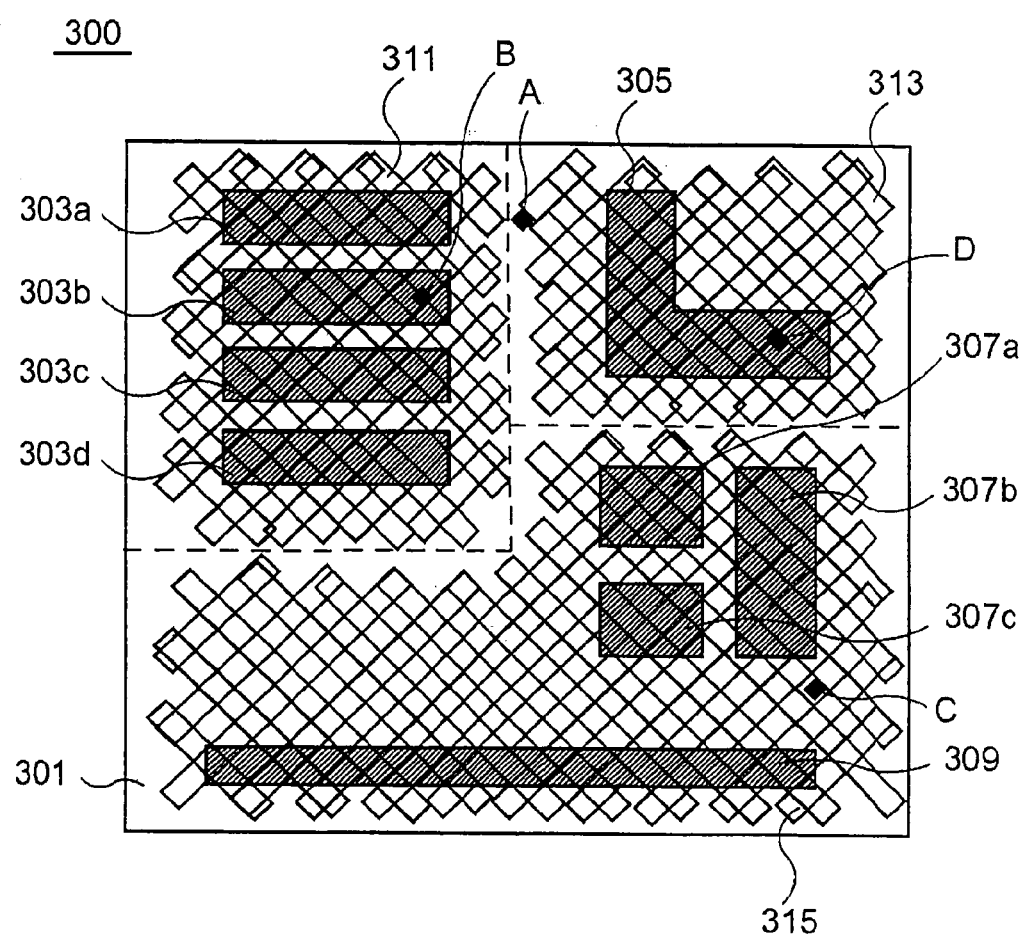
FIG. 3 is a plan view for describing a configuration of a semiconductor device according to a third embodiment of the present invention.

FIG. 3 is a plan view that typically depicts a configuration of a semiconductor device according to a third embodiment of the present invention.

The configuration of a semiconductor device 300 according to the third embodiment is basically equal to that of the semiconductor device according to the first embodiment. The third embodiment differs from the first embodiment in arrangement of P-wells, N-wells, and deep N-wells. In this embodiment, the same configuration as that according to the first embodiment will not be described repeatedly.

The semiconductor device 300 according to this embodiment is configured so that N-wells 303a, 303b, 303c, 303d, 305, 307a, 307b, 307c, and 309 are provided at an element formation surface of a P—Si substrate 301. An oblique lattice-type deep N-well 311 is provided to contact with lower surfaces of the N-wells 303a, 303b, 303c, and 303d. An oblique lattice-type deep N-well 313 is provided to contact with a lower surface of the N-well 305. An oblique lattice-type deep N-well 315 is provided to contact with lower surfaces of the N-wells 307a, 307b, 307c, and 309.

PMOS transistors are provided on all of the N-wells 303a, 303b, 303c, 303d, 305, 307a, 307b, 307c, and 309. In FIG. 3, only PMOS transistors B and D are shown for convenience of illustration. Further, although a plurality of NMOS transistors are provided on the P—Si substrate 301, only NMOS transistors A and C are shown in FIG. 3 for convenience of illustration.

In this embodiment, parts partitioned by dotted lines correspond to transistor formation regions, respectively.

Functions and advantages of the semiconductor device 300 according to this embodiment will be described. This embodiment exhibits the following functions and advantages as well as those of the semiconductor device according to the first embodiment.

According to this embodiment, noise propagation through the deep N-wells 311, 313, and 315 can be suppressed among three or more regions. Namely, the oblique lattice-type deep N-wells 311, 313, and 315 are isolated from one another. For example, the N-wells 303a, 303b, 303c, 303d, 305, 307a, 307b, 307c, and 309 are also isolated from one another. Due to this, even if noise occurs to the PMOS transistor B on the N-well 303b, propagation of the noise to the PMOS transistor D on the N-well 305 is suppressed. It is, therefore, possible to suppress the noise propagation through the deep N-wells 311, 313, and 315 among three or more regions.

<Fourth Embodiment>

Figure 4:
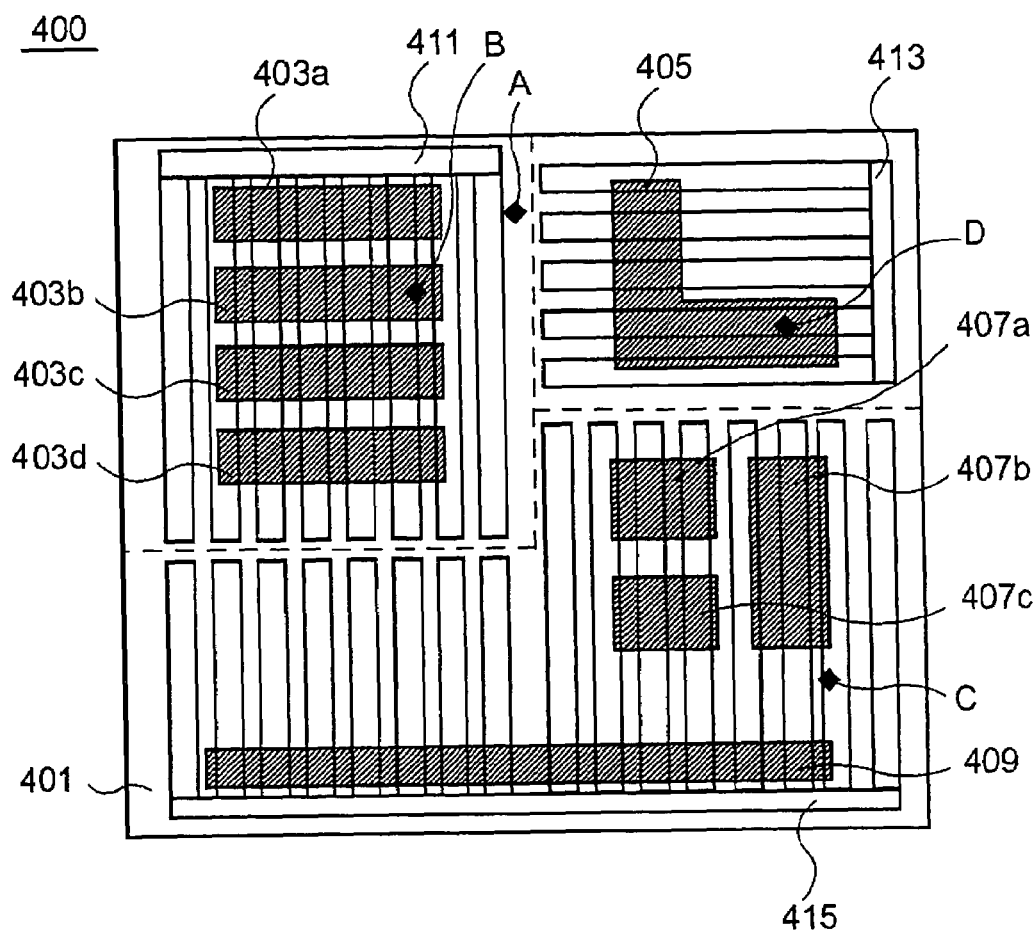
FIG. 4 is a plan view for describing a configuration of a semiconductor device according to a fourth embodiment of the present invention.

FIG. 4 is a plan view that typically depicts a configuration of a semiconductor device according to a fourth embodiment of the present invention.

The configuration of a semiconductor device 400 according to the fourth embodiment is basically equal to that of the semiconductor device according to the first embodiment. The fourth embodiment differs from the first embodiment in arrangement of P-wells, N-wells, and deep N-wells. In this embodiment, the same configuration as that according to the first embodiment will not be described repeatedly.

The semiconductor device 400 according to this embodiment is configured so that N-wells 403a, 403b, 403c, 403d, 405, 407a, 407b, 407c, and 409 are provided at an element formation surface of a P—Si substrate 401. A comb-type deep N-well 411 is provided to contact with lower surfaces of the N-wells 403a, 403b, 403c, and 403d. A comb-type deep N-well 413 is provided to contact with a lower surface of the N-well 405. A comb-type deep N-well 415 is provided to contact with lower surfaces of the N-wells 407a, 407b, 407c, and 409. Namely, if viewed from the element formation surface of the P—Si substrate 401, the comb-type deep N-wells 411, 413, and 415 are type to include a plurality of aligned N-linear regions and an N-region electrically connecting the linear regions to one another.

PMOS transistors are provided on all of the N-wells 403a, 403b, 403c, 403d, 405, 407a, 407b, 407c, and 409. In FIG. 4, only PMOS transistors B and D are shown for convenience of illustration. Further, although a plurality of NMOS transistors are provided on the P—Si substrate 401, only NMOS transistors A and C are shown in FIG. 4 for convenience of illustration.

In this embodiment, parts partitioned by dotted lines correspond to transistor formation regions, respectively.

Functions and advantages of the semiconductor device 400 according to this embodiment will be described. This embodiment exhibits the following functions and advantages as well as those of the semiconductor device according to the first embodiment.

According to this embodiment, noise propagation through the deep N-wells 411, 413, and 415 can be suppressed among three or more regions. Namely, the comb-type deep N-wells 411, 413, and 415 are isolated from one another. For example, the N-wells 403a, 403b, 403c, 403d, 405, 407a, 407b, 407c, and 409 are also isolated from one another. Due to this, even if noise occurs to the PMOS transistor B on the N-well 403b, propagation of the noise to the PMOS transistor D on the N-well 405 is suppressed. It is, therefore, possible to suppress the noise propagation through the deep N-wells 411, 413, and 415 among three or more regions.

<Fifth Embodiment>

Figure 11:
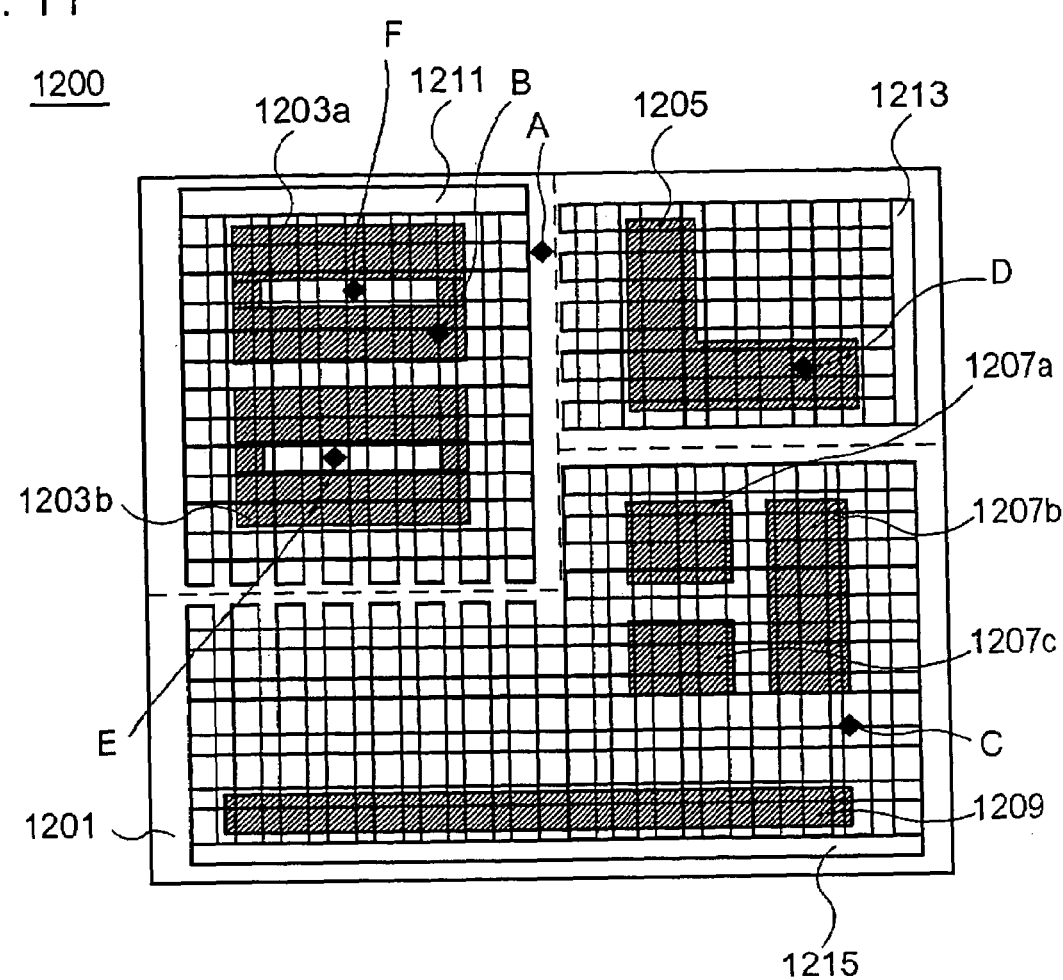
FIG. 11 is a plan view for describing a configuration of a semiconductor device according to a fifth embodiment of the present invention.
Figure 12:
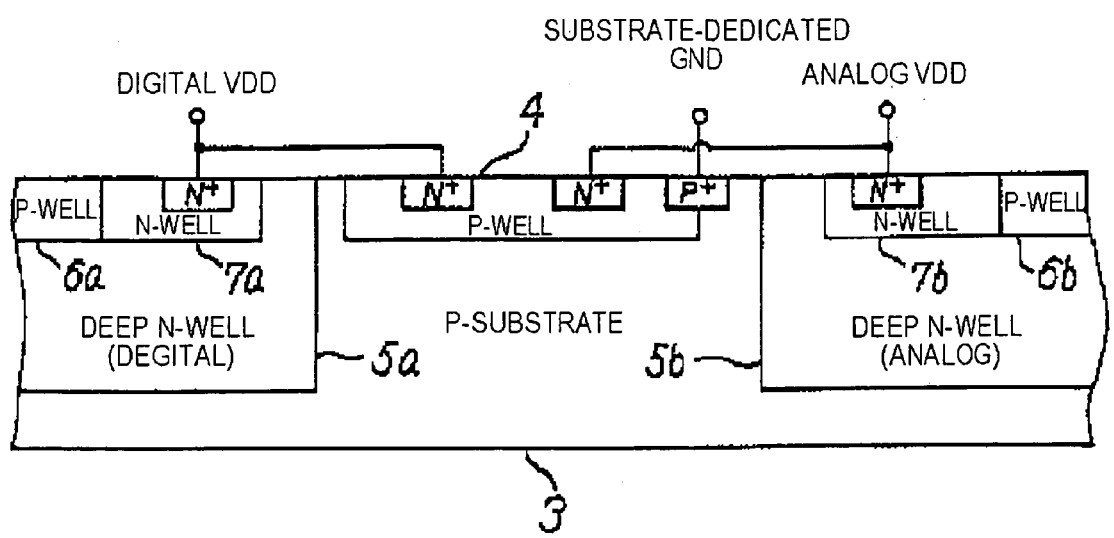
FIG. 12 is a longitudinal sectional view for describing a configuration of a conventionally-known semiconductor device.
Figure 13:
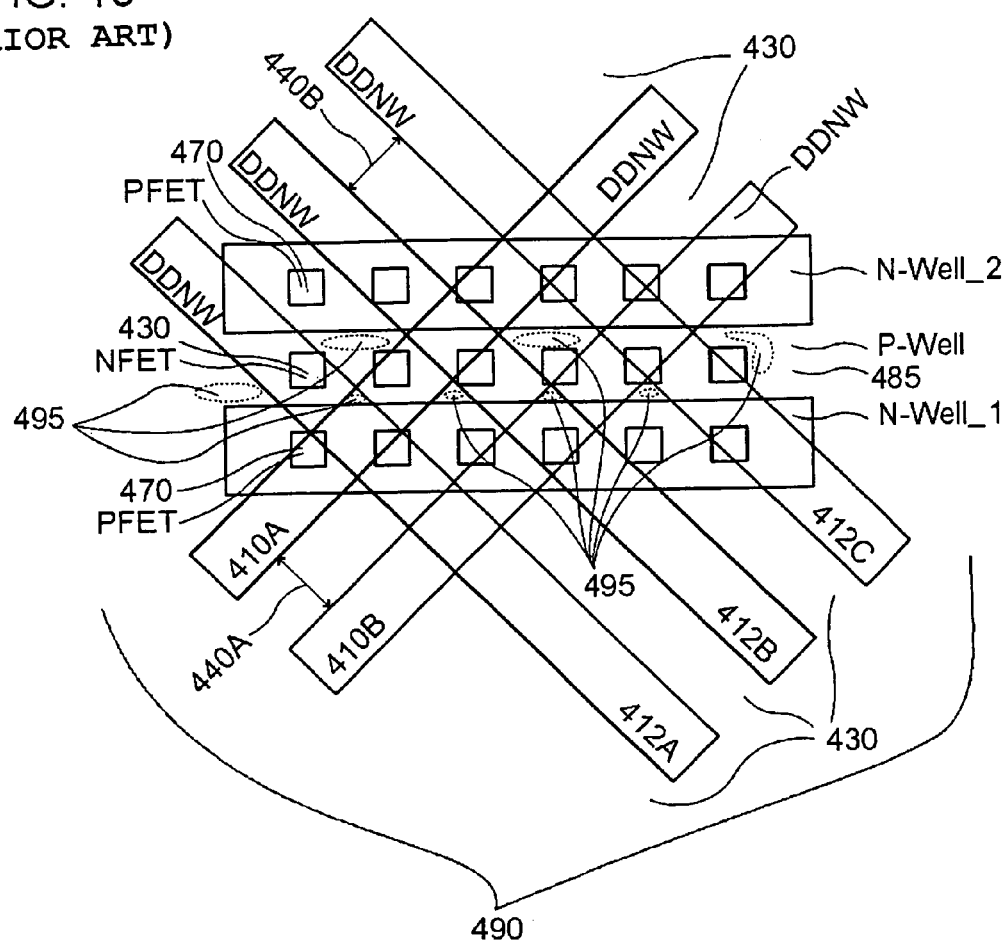
FIG. 13 is a plan view for describing a configuration of another conventionally-known semiconductor device.

FIG. 11 is a plan view that typically depicts a configuration of a semiconductor device according to a fifth embodiment of the present invention.

The configuration of a semiconductor device 1200 according to the fifth embodiment is basically equal to that of the semiconductor device according to the first embodiment. The fifth embodiment differs from the first embodiment in arrangement of P-wells, N-wells, and deep N-wells. In this embodiment, the same configuration as that according to the first embodiment will not be described repeatedly.

The semiconductor device 1200 according to this embodiment is configured so that N-wells 1203a, 1203b, 1205, 1207a, 1207b, 1207c, and 1209 are provided at an element formation surface of a P—Si substrate 1201. A square lattice-type deep N-well 1211 is provided to contact with lower surfaces of the N-wells 1203a and 1203b. A square lattice-type deep N-well 1213 is provided to contact with a lower surface of the N-well 1205. A square lattice-type deep N-well 1215 is provided to contact with lower surfaces of the N-wells 1207a, 1207b, 1207c, and 1209.

PMOS transistors are provided on all of the N-wells 1203a, 1203b, 1205, 1207a, 1207b, 1207c, and 1209. In FIG. 11, only PMOS transistors B and D are shown for convenience of illustration. Further, although a plurality of NMOS transistors are provided on the P—Si substrate 1201, only NMOS transistors A, C, E and F are shown in FIG. 11 for convenience of illustration.

In this embodiment, parts partitioned by dotted lines correspond to transistor formation regions, respectively.

Functions and advantages of the semiconductor device 1200 according to this embodiment will be described. This embodiment more significantly exhibits the functions and advantages that the thresholds of the gate electrodes of the NMOS transistor present on the P-regions can be integrally controlled in comparison with the semiconductor device according to the first embodiment.

According to this embodiment, in the transistor formation region including the deep N-well 1211, three P-regions, that is, a P-region inside the N-well 1203a, a P-region inside the N-well 1203b, and a P-region outside the N-wells 1203a and 1203b are provided. In this case, these three P-regions are electrically connected to one another through an opening that vertically penetrates the deep N-well 1211 and a bottom side thereof closer to the deep N-well 1211. Due to this, potentials of the P-region inside the N-well 1203a in which region an NMOS transistor E is provided and the P-region inside the N-well 1203b in which region an NMOS transistor F is provided are adjusted to be equal to a potential of the P-region outside the N-well 1203a,1203b in which region NMOS transistors A and C are provided. According to this embodiment, therefore, the semiconductor device 1200 can integrally control thresholds of gate electrodes of the NMOS transistors present on the P-regions surrounded by the N-wells on a plane arrangement.

<Reference Embodiment>

Figure 5:
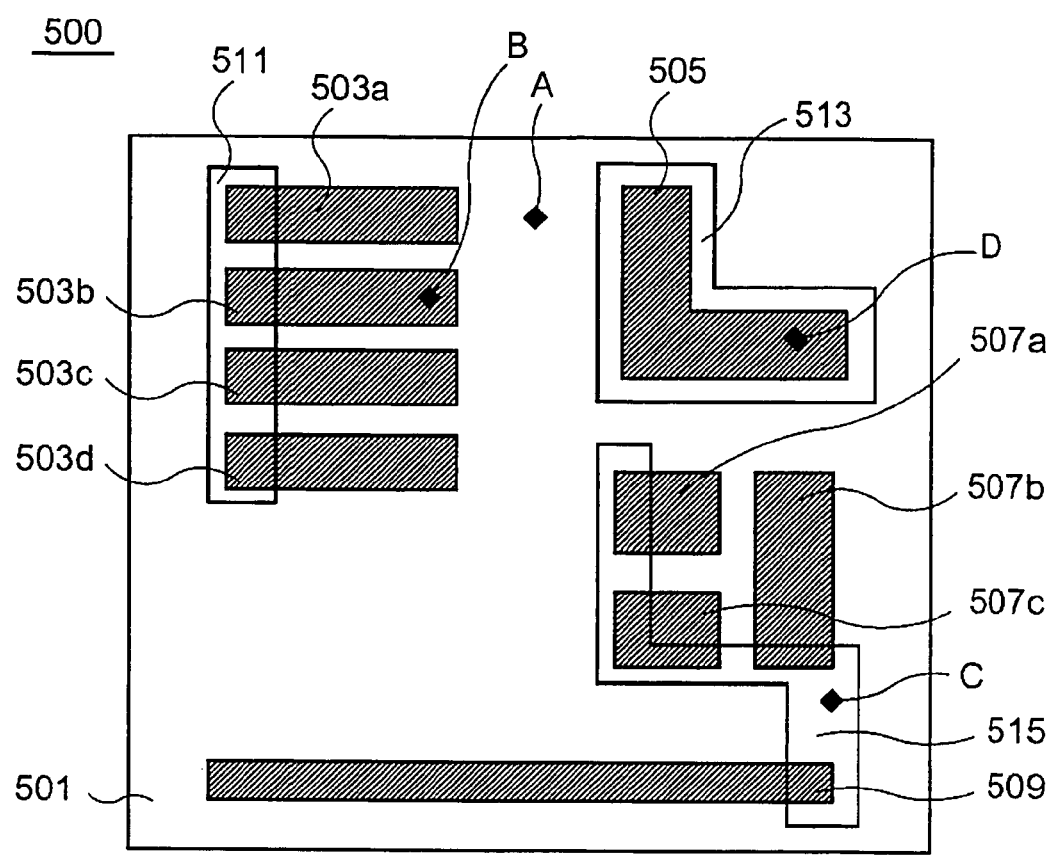
FIG. 5 is a plan view for describing a configuration of a semiconductor device according to a reference embodiment.

FIG. 5 is a plan view that typically depicts a configuration of a semiconductor device according to a reference embodiment.

The configuration of a semiconductor device 500 according to the reference embodiment is basically equal to that of the semiconductor device according to the first embodiment. The reference embodiment differs from the first embodiment in arrangement of P-wells, N-wells, and deep N-wells. In this embodiment, the same configuration as that according to the first embodiment will not be described repeatedly.

The semiconductor device 500 according to this embodiment is configured so that N-wells 503a, 503b, 503c, 503d, 505, 507a, 507b, 507c, and 509 are provided at an element formation surface of a P—Si substrate 501. A single-plate type deep N-well 511 is provided to contact with lower surfaces of the N-wells 503a, 503b, 503c, and 503d. A single-plate type deep N-well 513 is provided to contact with a lower surface of the N-well 505. A single-plate type deep N-well 515 is provided to contact with lower surfaces of the N-wells 507a, 507b, 507c, and 509.

PMOS transistors are provided on all of the N-wells 503a, 503b, 503c, 503d, 505, 507a, 507b, 507c, and 509. In FIG. 5, only PMOS transistors B and D are shown for convenience of illustration. Further, although a plurality of NMOS transistors are provided on the P—Si substrate 501, only NMOS transistors A and C are shown in FIG. 11 for convenience of illustration.

Disadvantages of the semiconductor device 500 according to the reference embodiment will be described.

In this reference embodiment, differently from the semiconductor device according to the first embodiment, it is difficult to improve flexibility in semiconductor device design and to widen manufacturing margin. Namely, in this plane arrangement, if the deep N-well 511 is deviated slightly leftward, the lower surfaces of the N-wells 503a, 503b, 503c, and 503d do not come in contact with the deep N-well 511. If so, it is difficult to adjust potentials of the N-well 503a, 503b, 503c, and 503d to be an equal potential through the deep N-well 511. With this arrangement, therefore, it is disadvantageously difficult to improve the flexibility in semiconductor device design and widen the manufacturing margin.

The embodiments of the present invention have been described so far with reference to the drawings. However, these embodiments are provided only for exemplary illustration of the present invention and various other configurations can be adopted.

Figure 6A:
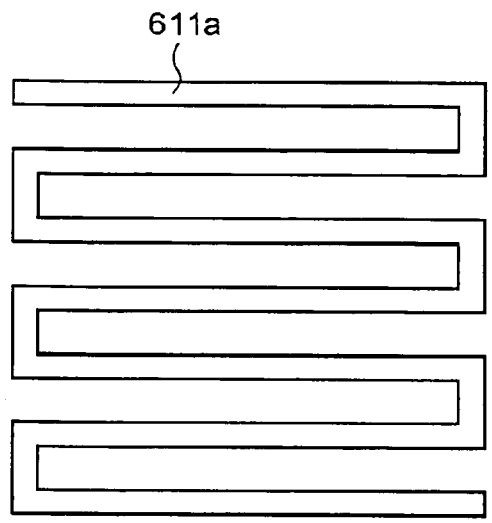
FIGS. 6A to 6D are plan views for describing plane shapes of deep N-wells of the semiconductor devices according to the embodiments of the invention.
Figure 6B:
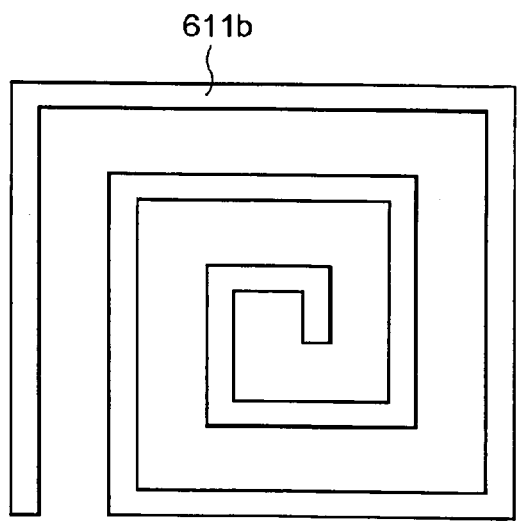
Figure 6C:
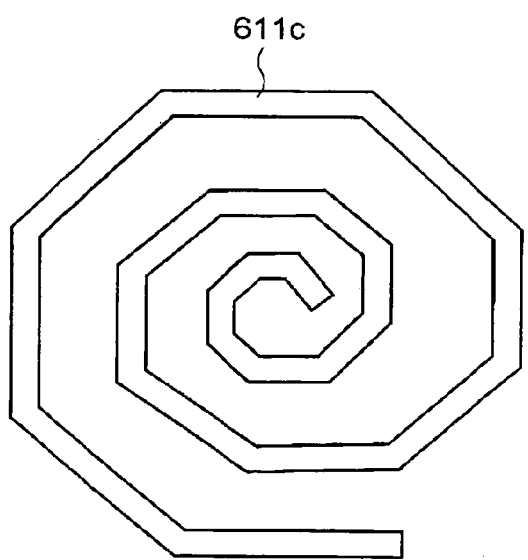
Figure 6D:
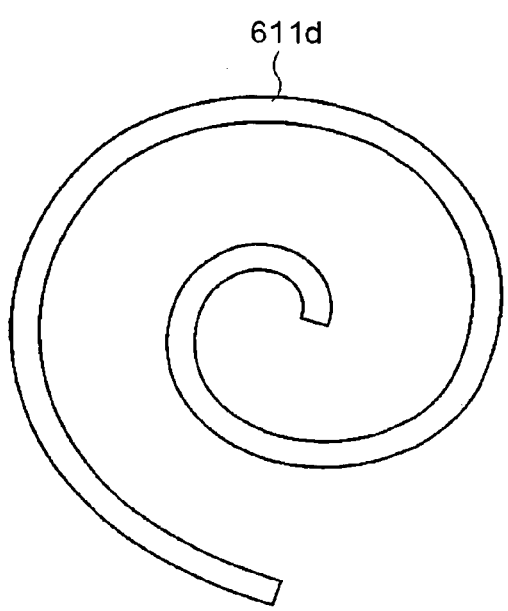

For example, the shape of the deep N-well is not limited to those described so far but various other shapes can be adopted. FIGS. 6A to 6D are plan views for describing plane shapes of the deep N-well of the semiconductor devices according to the embodiments of the invention. Each of the plane shapes of the deep N-well shown in FIGS. 6A to 6D includes a plurality of aligned linear regions and a region connecting the aligned linear regions to one another. As shown in FIG. 6A, for example, a meandering deep N-well 611a may be adopted. As shown in FIGS. 6B to 6D, spiral deep N-wells 611b, 611c, and 611d may be adopted. It is assumed in the present invention that each of these deep N-wells 611b, 611c, and 611d includes an opening (a gap) vertically penetrating the deep N-well.

It is apparent that the present invention is not limited to the above embodiment, that may be modified and changed without departing from the scope and spirit of the invention.

What is claimed is:

1. A semiconductor device comprising:
   a semiconductor substrate of one-conductivity-type; and
   a plurality of transistor formation regions provided at said semiconductor substrate,
   wherein each of said plurality of transistor formation regions includes:
   a first region of the one-conductivity-type formed at an element formation surface side of said semiconductor substrate;

a first transistor provided on said first region;

a second region of an reverse-conductivity-type formed at the element formation surface of said semiconductor substrate;

a second transistor provided on said second region; and a lower region of the reverse-conductivity-type formed on a bottom side relative to said first region and said second region, and coming in contact with a lower surface of said second region, wherein said lower region includes, in a plan view, an opening that vertically penetrates said lower region, wherein said first region and a bottom-side region of said semiconductor substrate are electrically connected to each other through said opening, wherein the lower region in each of said plurality of transistor formation regions is isolated from said lower region in others of said plurality of transistor formation regions, and wherein the second region in each of said plurality of transistor formation regions is isolated from said second region in others of said plurality of transistor formation regions.

2. The semiconductor device according to claim 1, wherein each of said plurality of transistor formation regions further includes a potential control unit electrically connected to said lower region.

3. The semiconductor device according to claim 1, wherein, in at least one formation region of said plurality of transistor formation regions, a plurality of said second regions are provided, and said plurality of second regions are electrically connected to one another through said lower region.

4. The semiconductor device according to claim 1, wherein, in at least one transistor formation region of said plurality of transistor formation regions, a plurality of said first regions are provided, and each of said plurality of first regions is electrically connected to the bottomside region of said semiconductor substrate through said opening.

5. The semiconductor device according to claim 1, wherein, in at least one transistor formation region of said plurality of transistor formation regions, said lower region is one of a lattice shape and a comb shape in a plan view.

6. The semiconductor device according to claim 1, wherein at least one transistor formation region of said plurality of transistor formation regions constitutes at least a part of one of a digital circuit and an analog circuit, and another at least one transistor formation region of said plurality of transistor formation regions constitute at least a part of the other one of the digital circuit and the analog circuit.

* * * * *